(12) United States Patent
Masumitsu et al.

(10) Patent No.: US 12,035,438 B2
(45) Date of Patent: Jul. 9, 2024

(54) DRIVING DEVICE, LIGHT EMITTING DEVICE, AND DRIVING METHOD

(71) Applicant: SONY SEMICONDUCTOR SOLUTIONS CORPORATION, Kanagawa (JP)

(72) Inventors: Naoki Masumitsu, Kumamoto (JP); Hayato Kamizuru, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 102 days.

(21) Appl. No.: 17/914,021

(22) PCT Filed: Mar. 5, 2021

(86) PCT No.: PCT/JP2021/008775
§ 371 (c)(1),
(2) Date: Sep. 23, 2022

(87) PCT Pub. No.: WO2021/199918
PCT Pub. Date: Oct. 7, 2021

(65) Prior Publication Data
US 2023/0129077 A1    Apr. 27, 2023

(30) Foreign Application Priority Data

Mar. 31, 2020   (JP) ................. 2020-061967

(51) Int. Cl.
*H05B 47/14*   (2020.01)
*G01S 7/497*   (2006.01)
*G01S 17/10*   (2020.01)

(52) U.S. Cl.
CPC .............. *H05B 47/14* (2020.01); *G01S 7/497* (2013.01); *G01S 17/10* (2013.01)

(58) Field of Classification Search
CPC ........ H05B 47/14; H05B 45/14; H05B 45/18; G01S 7/497; G01S 17/10; G01S 7/4811;
(Continued)

(56) References Cited

U.S. PATENT DOCUMENTS

2004/0202216 A1* 10/2004 Fairgrieve ............... H01S 5/042
372/38.07
2007/0291802 A1* 12/2007 Nishimura ............. G11B 7/126
(Continued)

FOREIGN PATENT DOCUMENTS

| JP | 2007-334972 | 12/2007 |
|---|---|---|
| JP | 2009-283542 | 12/2009 |
| JP | 2009-301618 | 12/2009 |
| JP | 2019-096642 | 6/2019 |
| WO | WO 2005/050800 | 6/2005 |
| WO | WO 2020/044818 | 3/2020 |

OTHER PUBLICATIONS

International Search Report and Written Opinion prepared by the Japan Patent Office on May 7, 2021, for International Application No. PCT/JP2021/008775, 3 pgs.

*Primary Examiner* — Ryan Jager
(74) *Attorney, Agent, or Firm* — SHERIDAN ROSS P.C.

(57) ABSTRACT

A driving device that includes a temperature monitoring circuit, a headroom voltage monitoring circuit, a power supply voltage monitoring circuit, and a control unit. The temperature monitoring circuit detects a temperature of a drive circuit that drives a light emitting element in a test light emission period of the light emitting element. The headroom voltage monitoring circuit detects a headroom voltage of the drive circuit in the test light emission period. The power supply voltage monitoring circuit detects a power supply voltage supplied to the light emitting element in the test light emission period. The control unit adjusts the power supply voltage in the test light emission period according to an input/output potential difference of the light emitting element varying depending on the temperature of drive circuit (Continued)

so as to obtain a headroom voltage necessary and sufficient for causing a prescribed drive current to flow through the light emitting element.

7 Claims, 6 Drawing Sheets

(58) Field of Classification Search
CPC ........ G01S 7/4914; G01S 17/36; G01S 7/484;
H01S 5/062
USPC ........................................................ 315/308
See application file for complete search history.

(56) References Cited

U.S. PATENT DOCUMENTS

| | | | |
|---|---|---|---|
| 2009/0040904 A1 | 2/2009 | Matsumoto et al. | |
| 2009/0289559 A1* | 11/2009 | Tanaka | H05B 45/347 |
| | | | 315/307 |
| 2009/0310461 A1 | 12/2009 | Kajiwara et al. | |
| 2019/0081095 A1* | 3/2019 | Hanzawa | H01L 27/1463 |
| 2019/0103726 A1* | 4/2019 | Bazzani | H02M 3/156 |
| 2023/0129077 A1* | 4/2023 | Masumitsu | H05B 45/18 |
| | | | 315/308 |

* cited by examiner

DRIVING DEVICE, LIGHT EMITTING DEVICE, AND DRIVING METHOD

CROSS REFERENCE TO RELATED APPLICATIONS

This application is a national stage application under 35 U.S.C. 371 and claims the benefit of PCT Application No. PCT/JP2021/008775, having an international filing date of 5 Mar. 2021, which designated the United States, which PCT application claimed the benefit of Japanese Patent Application No. 2020-061967, filed 31 Mar. 2020, the entire disclosures of each of which are incorporated herein by reference.

TECHNICAL FIELD

The present disclosure relates to a driving device, a light emitting device, and a driving method.

BACKGROUND ART

A ranging device of a time of flight (ToF) method using a light emitting element, such as a semiconductor laser, is required to emit laser light having a higher output with a pulse having a higher frequency in order to extend a measurement distance and improve safety. A driving device that drives the light emitting element needs to optimize a drive current of the light emitting element in a case where the laser light having the higher output is emitted with the pulse having the higher frequency.

For this reason, there is a driving device that causes a light emitting element to perform test light emission before distance measurement is performed, performs control to suppress variation of a drive current of the light emitting element in a test light emission period, and then, causes the light emitting element to perform main light emission for the distance measurement (see, for example, Patent Document 1).

CITATION LIST

Patent Document

Patent Document 1: Japanese Patent Application Laid-Open No. 2019-096642

SUMMARY OF THE INVENTION

Problems to be Solved by the Invention

However, the conventional driving device has room for improvement in terms of low power consumption.

Therefore, the present disclosure proposes a driving device, a light emitting device, and a driving method capable of reducing power consumption of a light emitting element.

Solutions to Problems

According to the present disclosure, a driving device is provided. The driving device includes a temperature monitoring circuit, a headroom voltage monitoring circuit, a power supply voltage monitoring circuit, and a control unit. The temperature monitoring circuit detects a temperature of a drive circuit that drives a light emitting element in a test light emission period of the light emitting element. The headroom voltage monitoring circuit detects a headroom voltage of the drive circuit in the test light emission period. The power supply voltage monitoring circuit detects a power supply voltage supplied to the light emitting element in the test light emission period. The control unit adjusts the power supply voltage in the test light emission period according to an input/output potential difference of the light emitting element that varies depending on the temperature of the drive circuit so as to obtain a headroom voltage necessary and sufficient for causing a prescribed drive current to flow through the light emitting element.

MODE FOR CARRYING OUT THE INVENTION

Hereinafter, embodiments of the present disclosure will be described in detail with reference to the drawings. Note that the same parts will be denoted by the same reference signs in each of the following embodiments, and the redundant description thereof will be omitted.

[1. Configuration Example of Ranging Module]

Figure 1:
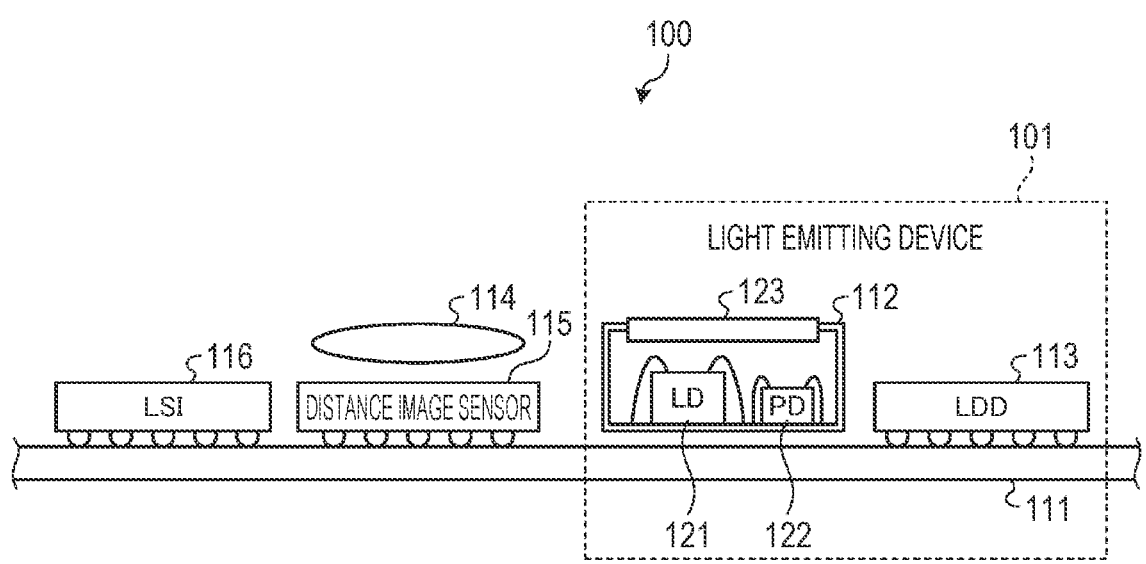
FIG. 1 is a diagram illustrating a configuration example of a ranging module according to an embodiment of the present disclosure.

FIG. 1 is a diagram illustrating a configuration example of a ranging module according to an embodiment of the present disclosure. A ranging module 100 illustrated in FIG. 1 is a device that measures a distance to an object by a time of flight (ToF) method. The ranging module 100 emits laser light, receives the laser light reflected by the object, and measures the distance to the object on the basis of time from the emission of the laser light to the reception of the laser light or a phase difference between the emitted light and the reflected light.

The ranging module 100 includes a substrate 111, an optical module 112, a driving device (hereinafter, described as "LDD: Laser Diode Driver") 113, a lens 114, a distance image sensor 115, and a large scale integrated circuit (LSI) 116.

The optical module 112, the LDD 113, the lens 114, the distance image sensor 115, and the LSI 116 are provided on the substrate 111. The optical module 112 and the LDD 113 function as a light emitting device 101 that emits laser light.

The optical module 112 includes a light emitting element (hereinafter, described as "LD: Laser Diode") 121, a photo diode (PD) 122, and a diffuser 123. The LD 121 emits laser light having a predetermined wavelength. The LD 121 emits the laser light to be used to measure the distance to the object according to the control of the LDD 113.

The PD 122 is a light receiving element that is used for measurement of the intensity of the laser light emitted from the LD 121. The PD 122 outputs a light reception signal corresponding to the amount of received light. The PD 122 receives return light, which is a part of the laser light that is emitted from the LD 121, is reflected by the diffuser 123, and returns, and outputs the light reception signal corresponding to the amount of received return light.

The diffuser 123 is a diffusion member provided such that the laser light emitted from the LD 121 satisfies a safety standard defined by International Electrotechnical Commission (IEC) or the like. The laser light emitted from the LD 121 passes through the diffuser 123 to become diffused light. A part of the laser light is reflected by the diffuser 123, and the return light is received by the PD 122.

The LDD 113 supplies a drive current to the LD 121 to control driving of the LD 121. Furthermore, the LDD 113 performs auto power control (APC) for controlling the intensity of the laser light emitted from the LD 121 on the basis of the light reception signal received from the PD 122.

The lens 114 forms an image of reflected light, which is the laser light emitted from the LD 121 and reflected from the object, on a light receiving surface of the distance image sensor 115. The distance image sensor 115 is a distance image sensor of a ToF method, and detects the distance (depth) to the object for each pixel. For example, the distance image sensor 115 detects the phase difference between the laser light emitted from the LD 121 and the reflected light from the object for each pixel, and outputs information indicating the phase difference to the LSI 116.

The LSI 116 controls the LDD 113 and the distance image sensor 115. Furthermore, the LSI 116 derives the distance to the object on the basis of the information regarding the phase difference input from the distance image sensor 115. Note that the configuration of the ranging module 100 illustrated in FIG. 1 is an example, and other configurations may be used as long as the distance measurement using the Tof method can be performed.

[2. Configuration Example of LDD]

Figure 2:
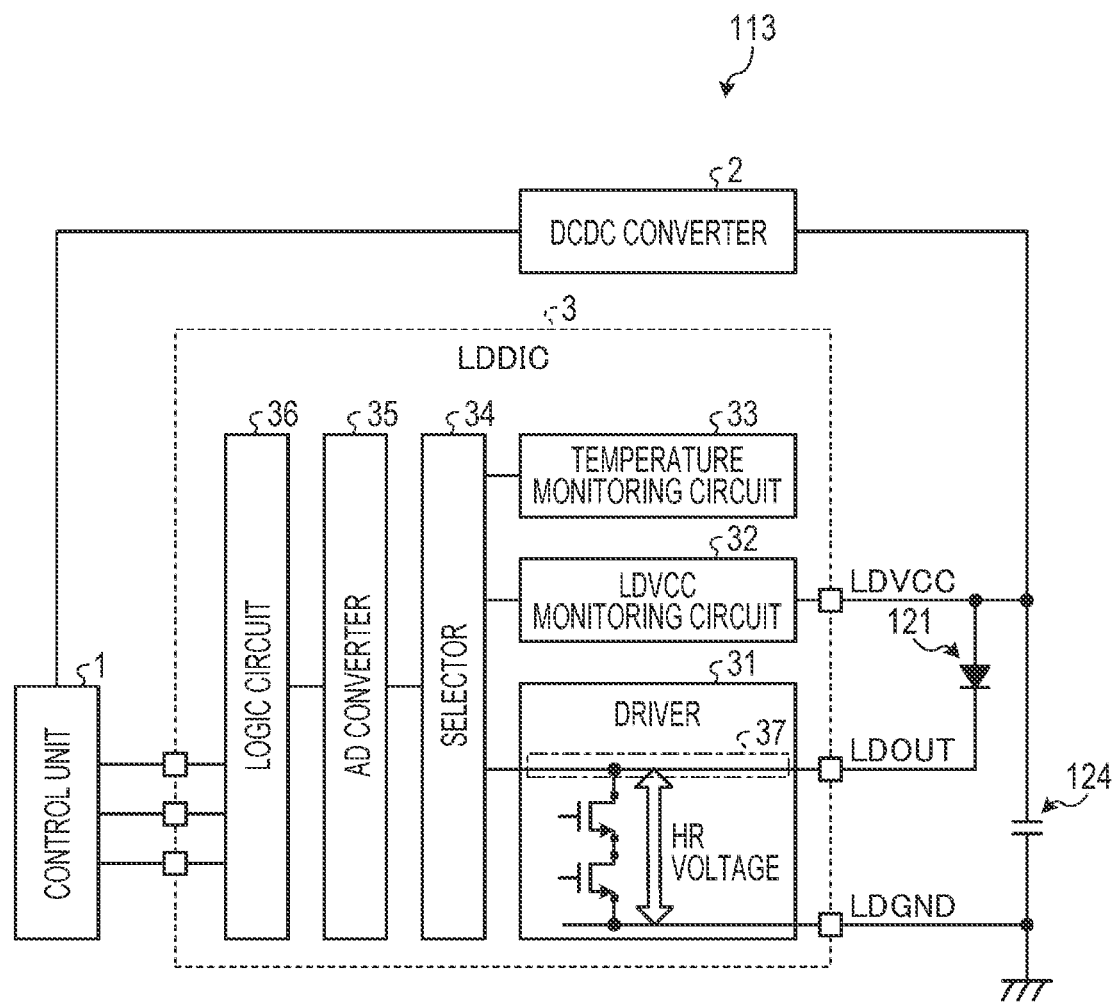
FIG. 2 is a diagram illustrating a configuration example of an LDD according to the embodiment of the present disclosure.

Next, a configuration example of the LDD 113 will be described with reference to FIG. 2. FIG. 2 is a diagram illustrating a configuration example of the LDD according to the embodiment of the present disclosure. As illustrated in FIG. 2, the LDD 113 includes a control unit 1, a DCDC converter 2, and a laser diode driver integrated circuit (LDDIC) 3.

The LDDIC 3 includes a drive circuit (hereinafter, described as a "driver 31"), a power supply voltage (hereinafter, described as "LDVCC") monitoring circuit 32, a temperature monitoring circuit 33, a selector 34, an AD converter 35, and a logic circuit 36. The driver 31 includes a metal oxide semiconductor (MOS) transistor and a headroom (hereinafter, described as "HR") voltage monitoring circuit 37.

The control unit 1 is connected to the DCDC converter 2 and the LDDIC 3. The DCDC converter 2 is connected to an anode of the LD 121 and the LDVCC monitoring circuit 32. Furthermore, the DCDC converter 2 is connected to a ground with a capacitor 124 interposed therebetween. The LD 121 has a cathode connected to the driver 31.

Note that the control unit 1 is connected to the LSI 116 although not illustrated herein. The control unit 1 controls the operation of the DCDC converter 2 in accordance with the control of the LSI 116 to adjust LDVCC of a direct current to be supplied to the LD 121. Furthermore, the control unit 1 turns on a MOS transistor in the driver 31 and supplies a drive current to the LD 121 to cause the LD 121 to emit light in accordance with the control of the LSI 116.

Figure 3:
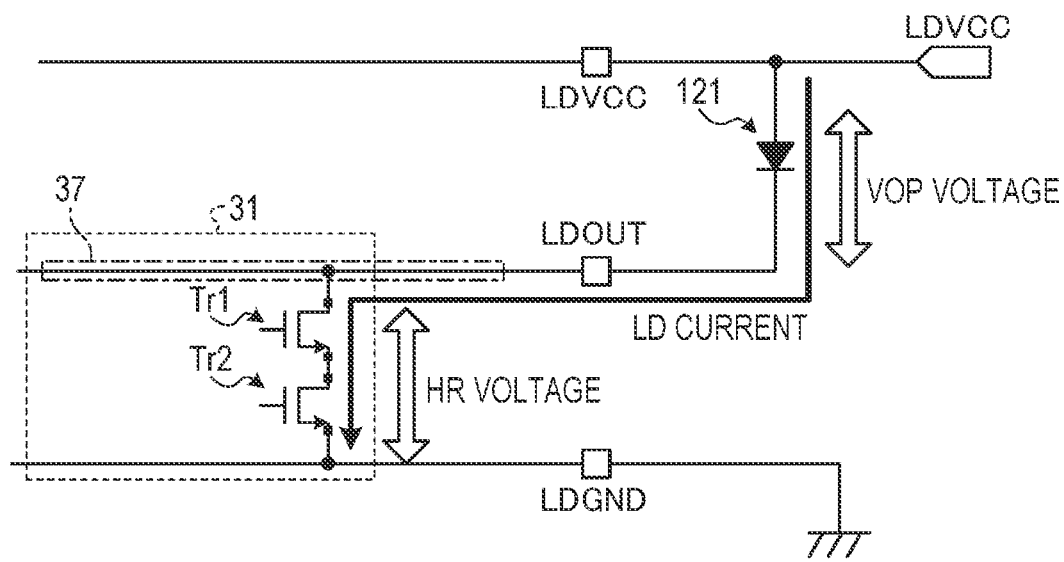
FIG. 3 is a circuit diagram illustrating a configuration example of a drive circuit according to the embodiment of the present disclosure.
Figure 4:
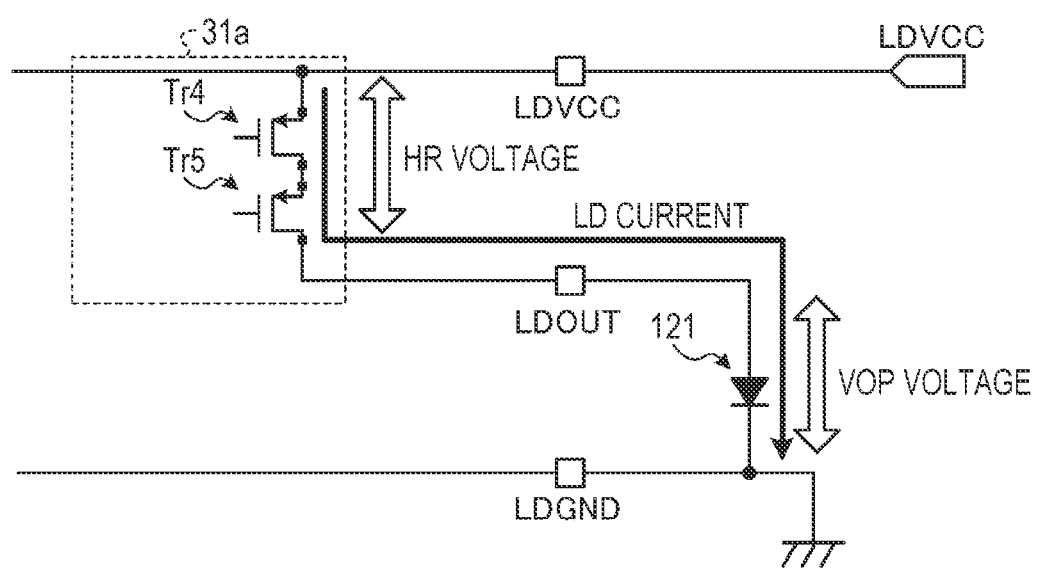
FIG. 4 is a circuit diagram illustrating a configuration example of the drive circuit according to the embodiment of the present disclosure.

Here, a configuration example of the driver 31 will be described with reference to FIGS. 3 and 4. FIGS. 3 and 4 are circuit diagrams illustrating the configuration example of the drive circuit according to the embodiment of the present disclosure. As illustrated in FIG. 3, the driver 31 includes two NMOS transistors Tr1 and Tr2. The NMOS transistors Tr1 and Tr2 are connected in series between the cathode of the LD 121 whose anode is connected to a wiring to which LDVCC is supplied and the ground.

The driver 31 turns on the NMOS transistors Tr1 and Tr2 and causes a drive current (hereinafter, referred to as "LD current") to flow through the LD 121, thereby causing the LD 121 to emit light. Furthermore, the driver 31 turns off the NMOS transistors Tr1 and Tr2 to stop the light emission of the LD 121.

Note that the light emission of the LD 121 can also be controlled by a driver 31a illustrated in FIG. 4. The driver 31a includes two PMOS transistors Tr4 and Tr5. The PMOS transistors Tr4 and Tr5 are connected in series between a wiring to which LDVCC is supplied and the anode of the LD 121. The LD 121 has a cathode connected to the ground.

The driver 31a turns on the PMOS transistors Tr4 and Tr5 and causes an LD current to flow through the LD 121, thereby causing the LD 121 to emit light. Furthermore, the driver 31a turns off the PMOS transistors Tr4 and Tr5 to stop the light emission of the LD 121. The driver 31 illustrated in FIG. 2 may be configured by the driver 31a illustrated in FIG. 4.

Characteristics of the drive circuit are affected unless the drivers 31 and 31a secure an HR voltage equal to or higher than a certain voltage, and it is difficult for the drivers 31 and 31a to cause a prescribed LD current according to the specifications to flow through the LD 121 and to cause the LD 121 to emit light with a desired output intensity. For this reason, the control unit 1 needs to set LDVCC such that the HR voltage can be sufficiently secured with respect to an input/output potential difference (hereinafter, described as "VOP") of the LD 121 when a desired LD current flows.

The HR voltage is a voltage corresponding to a potential difference between the cathode of the LD 121 and the ground in the driver 31 illustrated in FIG. 3. Furthermore, the HR voltage is a voltage corresponding to a potential difference between the wiring to which LDVCC is supplied and the anode of the LD 121 in the driver 31a illustrated in FIG. 4.

However, VOP varies under the influence of temperature variation. Furthermore, LDVCC also varies under the influence of the temperature variation. For this reason, for example, when VOP increases due to the temperature variation in the drivers 31 and 31a, it is difficult to secure a sufficient HR voltage, and it is difficult to cause the desired LD current to flow through the LD 121.

Figure 5:
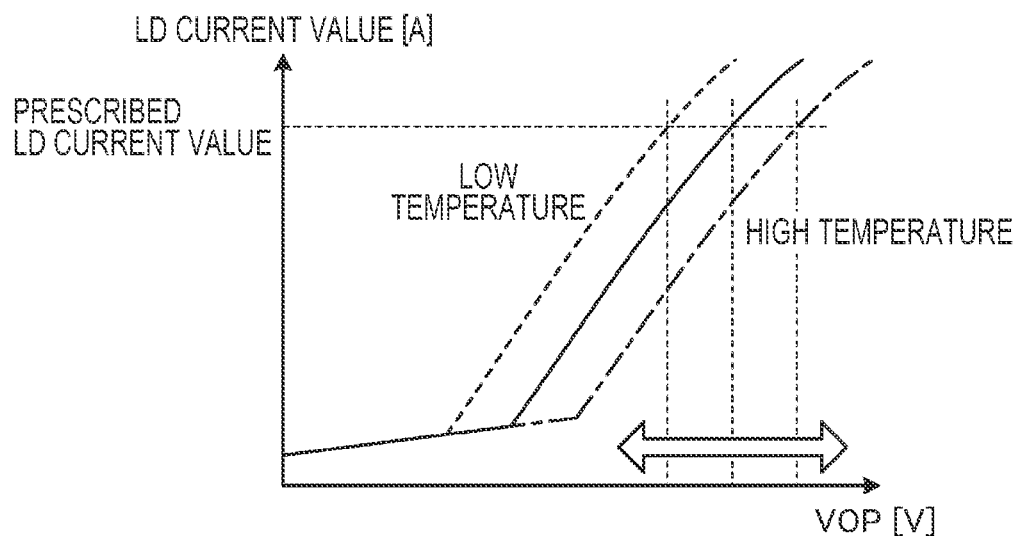
FIG. 5 is a view illustrating a relationship among a temperature, an LD current value, and VOP according to the embodiment of the present disclosure.

Here, a relationship among the temperature of the drive circuit, an LD current value, and VOP will be described with reference to FIG. 5. FIG. 5 is a view illustrating the relationship among the temperature, the LD current value, and VOP according to the embodiment of the present disclosure. As illustrated in FIG. 5, in a case where a prescribed LD current is caused to flow, VOP increases as the temperature increases and decreases as the temperature decreases.

For this reason, when the LDD 113 tries to cause an LD current having the prescribed LD current value in a case where a room-temperature state is switched to a high-temperature state, it is difficult to secure a sufficient HR voltage unless LDVCC is increased, and it is difficult to cause the desired LD current to flow through the LD 121.

For this reason, the sufficient HR voltage has been secured by increasing LDVCC excessively to some extent, for example, in the case where the room-temperature state is switched to the high-temperature state. However, power is wastefully consumed in a case where LDVCC is higher than a minimum voltage required to cause the desired LD current to flow, and there is room for improvement in terms of low power consumption.

Therefore, the control unit 1 of the LDD 113 has a configuration for adjusting LDVCC according to VOP of the LD 121 that varies depending on the temperature of the driver 31 or 31a so as to obtain the HR voltage that is necessary and sufficient for causing the prescribed LD current to flow through the LD 121. Returning to FIG. 2, the configuration for adjusting LDVCC to secure the necessary and sufficient HR voltage will be described.

The LDD 113 performs a process of adjusting LDVCC to secure the necessary and sufficient HR voltage in a test light emission period of the LD 121. Specifically, the HR voltage monitoring circuit 37 detects an HR voltage of the driver 31 and outputs the detected HR voltage to the selector 34.

The HR voltage monitoring circuit 37 detects a potential difference between the cathode of the LD 121 and the ground as the HR voltage and outputs the HR voltage to the selector 34. Note that, in the case of the driver 31a illustrated in FIG. 4, the HR voltage monitoring circuit 37 detects the potential difference between the wiring to which LDVCC is supplied and the anode of the LD 121 as the HR voltage and outputs the HR voltage to the selector 34.

The LDVCC monitoring circuit 32 detects LDVCC supplied to the LD 121 and outputs the detected LDVCC to the selector 34. The temperature monitoring circuit 33 detects a temperature of the driver 31 and outputs the temperature to the selector 34. Note that, in a case where the driver 31a illustrated in FIG. 4 is provided in the LDD 113, the temperature monitoring circuit 33 detects a temperature of the driver 31a and outputs the temperature to the selector 34.

The selector 34 sequentially selects signals one by one from three analog signals according to the HR voltage from the HR voltage monitoring circuit 37, LDVCC from the LDVCC monitoring circuit 32, and the temperature of the temperature monitoring circuit 33, and outputs the selected signal to the AD converter 35.

The AD converter 35 converts the analog signal according to the HR voltage, the analog signal according to LDVCC, and the analog signal according to the temperature sequentially input from the selector 34 into digital signals, and outputs the digital signals to the logic circuit 36.

The logic circuit 36 converts the digital signals input from the AD converter 35 into information indicating a level of the HR voltage, information indicating a level of LDVCC, and information indicating the level of the temperature, respectively, and outputs the information to the control unit 1.

The control unit 1 includes a microcomputer including a central processing unit (CPU), a read only memory (ROM), a random access memory (RAM), and the like, and various circuits. Note that some or all of the control unit 1 may be configured by hardware such as an application specific integrated circuit (ASIC) or a field programmable gate array (FPGA).

The control unit 1 adjusts LDVCC by controlling the operation of the DCDC converter 2 as the CPU executes a program stored in the ROM using the RAM as a work area.

For example, the control unit 1 stores in advance the information indicating the relationship among the temperature, the LD current value, and the VOP illustrated in FIG. 5. The control unit 1 can calculate VOP in a case where the prescribed LD current flows at the temperature detected by the temperature monitoring circuit 33 by referring to the information indicating the relationship among the temperature, the LD current value, and VOP.

Even if LDVCC varies due to the temperature variation, the control unit 1 can acquire LDVCC when the temperature has been detected by the temperature monitoring circuit 33 from the LDVCC monitoring circuit 32. Furthermore, the control unit can acquire the HR voltage when the temperature has been detected by the temperature monitoring circuit 33 from the HR voltage monitoring circuit 37.

For this reason, the control unit 1 can adjust LDVCC in the test light emission period according to VOP of the LD 121 that varies depending on the temperature of the driver 31 so as to obtain the HR voltage that is necessary and sufficient for causing the prescribed LD current to flow through the LD 121.

In this manner, the control unit 1 supplies the LD 121 with the minimum required LDVCC in order to secure the HR voltage required to cause the prescribed (for example, in the specifications) LD current to flow through the LD 121. Therefore, the control unit 1 does not wastefully set LDVCC high, the power consumption of the LD 121 can be reduced.

Figure 6:
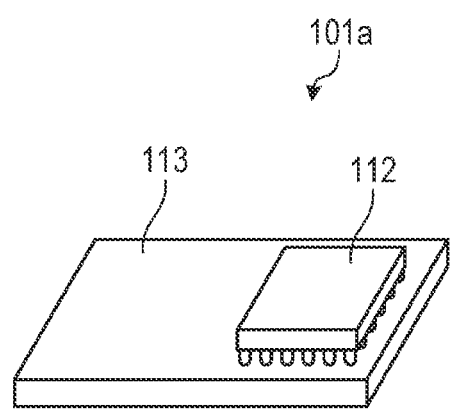
FIG. 6 is a view illustrating a modified example of a light emitting device according to the embodiment of the present disclosure.

Furthermore, the light emitting device 101 can also be downsized according to the LDD 113. Next, a configuration of a light emitting device that can be downsized by adopting the driver 31 will be described with reference to FIG. 6. FIG. 6 is a view illustrating a modified example of the light emitting device according to the embodiment of the present disclosure.

Although the LDD 113 and the optical module 112 are placed flat on the same plane on the substrate 111 in the light emitting device 101 illustrated in FIG. 1, a light emitting device 101a according to the modified example has a structure in which the optical module 112 is stacked on the LDD 113 as illustrated in FIG. 6.

Therefore, the light emitting device 101a can reduce the occupied area on the substrate 111 as compared with the case where the LDD 113 and the optical module 112 are placed flat on the same plane on the substrate 111, and thus, can be downsized.

Furthermore, in the light emitting device 101a, a temperature of the LDD 113 in the lower layer increases due to heat generated by light emission of the optical module 112 in the upper layer, but a minimum required LDVCC is supplied to the LD 121 by the driver 31 provided in the LDD 113, and thus, various costs and power can be reduced.

[3. Operation Example of LDD]

Figure 7:
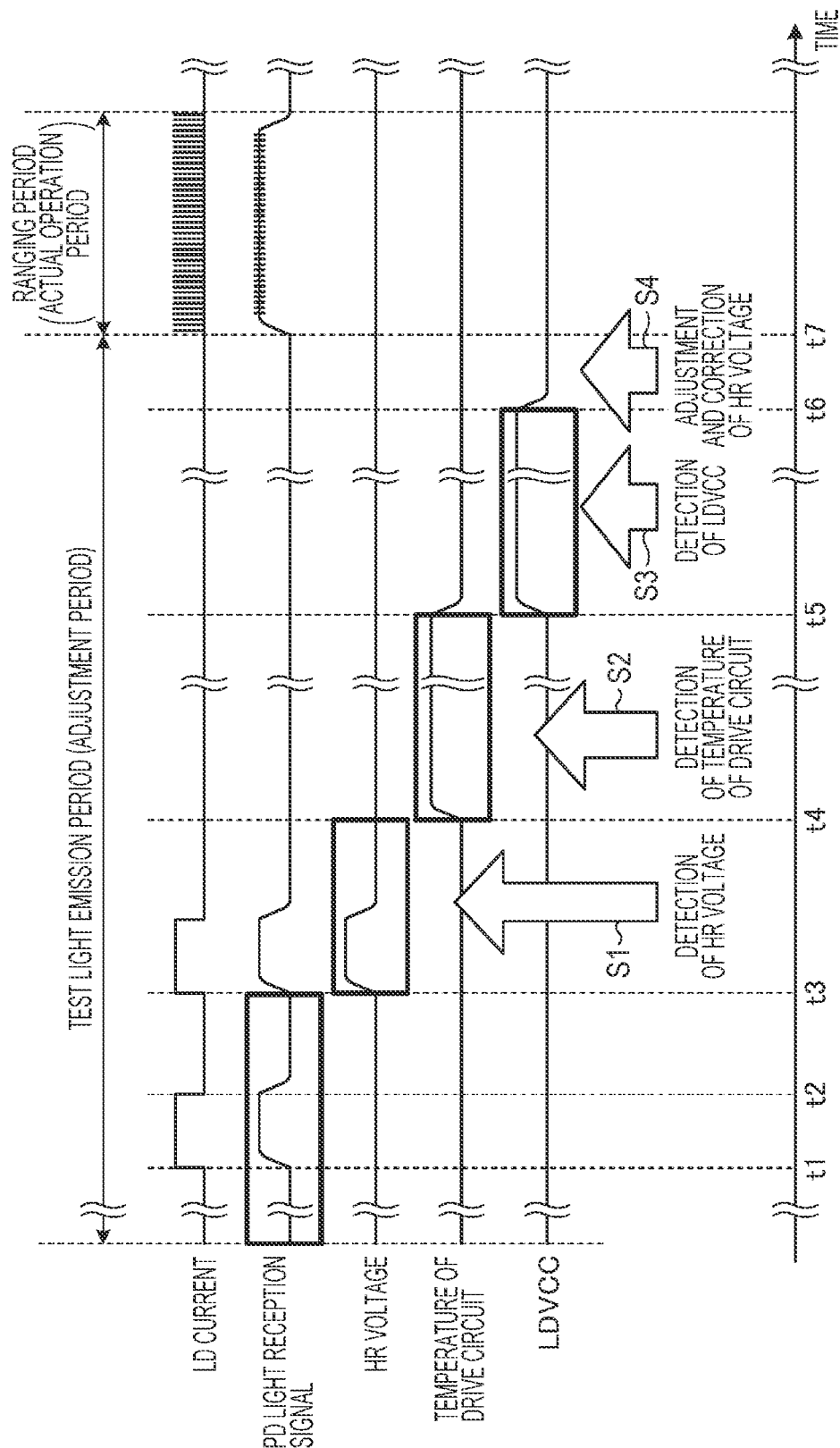
FIG. 7 is a timing chart illustrating operations of the LDD according to the embodiment of the present disclosure.

Next, an operation example of the LDD 113 will be described with reference to FIG. 7. FIG. 7 is a timing chart illustrating operations of the LDD according to the embodiment of the present disclosure. In FIG. 7, from the top, a supply timing of the LD current, a reception timing of the light reception signal of the PD, a detection timing of the HR voltage, a temperature detection timing of the drive circuit, and a detection timing of LDVCC are sequentially illustrated in time series.

As illustrated in FIG. 7, an operation period of the LDD 113 is roughly divided into a test light emission period (adjustment period) and a ranging period (actual operation period) period. The LDD 113 repeatedly executes an operation in the test light emission period and an operation in the ranging period. Note that FIG. 1 illustrates an operation in a first test light emission period and the operation in the ranging period.

The LDD 113 repeats an operation of causing the LD 121 to perform test light emission in a test period, performing the APC and adjustment and correction of LDVCC, and then, causing the LD 121 to perform main light emission with a high-frequency pulse for distance measurement.

For example, the LDD 113 causes the LD 121 to perform test light emission in a period from time t1 to time t2, and performs the APC on the basis of the light reception signal output from the PD 122 in this period. Thereafter, the LDD 113 causes the LD 121 to perform test light emission in a period from time t3 to time t4, and detects the HR voltage in this period (step S1).

Subsequently, the LDD 113 detects the temperature of the driver 31 in a period from time t4 to time t5 (step S2). Thereafter, the LDD 113 detects LDVCC in a period from time t5 to time t6 (step S3).

Then, the LDD 113 performs adjustment and correction of the HR voltage in a period from time t6 to time t7 before entering the ranging period (step S4). At this time, the LDD 113 adjusts the HR voltage by adjusting LDVCC according to VOP of the LD that varies depending on the temperature of the driver 31 so as to obtain the HR voltage that is necessary and sufficient for causing the prescribed LD current to flow through the LD 121.

Then, after the end of the ranging period, the LDD 113 causes the LD 121 to perform test light emission to perform the APC, and the detection of the HR voltage, the temperature detection of the driver 31, the detection of LDVCC, and the adjustment and correction of the HR voltage.

Here, the ranging period in which the LD 121 performs the main light emission is present between the first test period and the second test period. For this reason, the temperature of the driver 31 is higher in the second test period than in the first test period.

Therefore, LDVCC also varies, and input-output voltage characteristics of the NMOS transistors Tr1 and Tr2 of the driver 31 also vary. As a result, the HR voltage that needs to be secured to cause the prescribed LD current to flow through the LD 121 also varies between the first test period and the second test period.

For this reason, even if the LDD 113 adjusts LDVCC so as to secure the same HR voltage as the HR voltage secured in the first test period during the second test period, there is a case where it is difficult for the LD 121 to set the HR voltage necessary and sufficient for causing the prescribed LD current to flow.

Therefore, the control unit 1 of the LDD 1 corrects LDVCC on the basis of the amount of temperature variation of the driver 31 detected by the temperature monitoring circuit 33 in the test light emission period before and after the main light emission of the LD 121 and a correction coefficient of LDVCC according to the amount of temperature variation.

For example, the control unit 1 stores, in advance, a table in which the amount of temperature variation of the driver 31 is associated with the amount of change in the necessary and sufficient HR voltage changed by the temperature variation. Then, the control unit 1 calculates a difference between the temperature of the driver 31 detected in the first test period and the temperature of the driver 31 detected in the second test period.

The control unit 1 derives the necessary and sufficient HR voltage varying depending on the calculated temperature difference on the basis of the table, calculates the correction coefficient that needs to be multiplied to LDVCC in order to obtain the derived HR voltage, and multiplies the adjusted LDVCC by the correction coefficient to correct LDVCC. Therefore, the LDD 113 can more accurately set the necessary and sufficient HR voltage.

Note that the LDD 113 executes the processing in the order of the detection of the HR voltage, the temperature detection of the driver 31, and the detection of LDVCC in the example illustrated in FIG. 7, but the order of the detection of the HR voltage, the temperature detection of the driver 31, and the detection of LDVCC can be changed to any order.

[4. Processing Executed by Control Unit]

Figure 8:
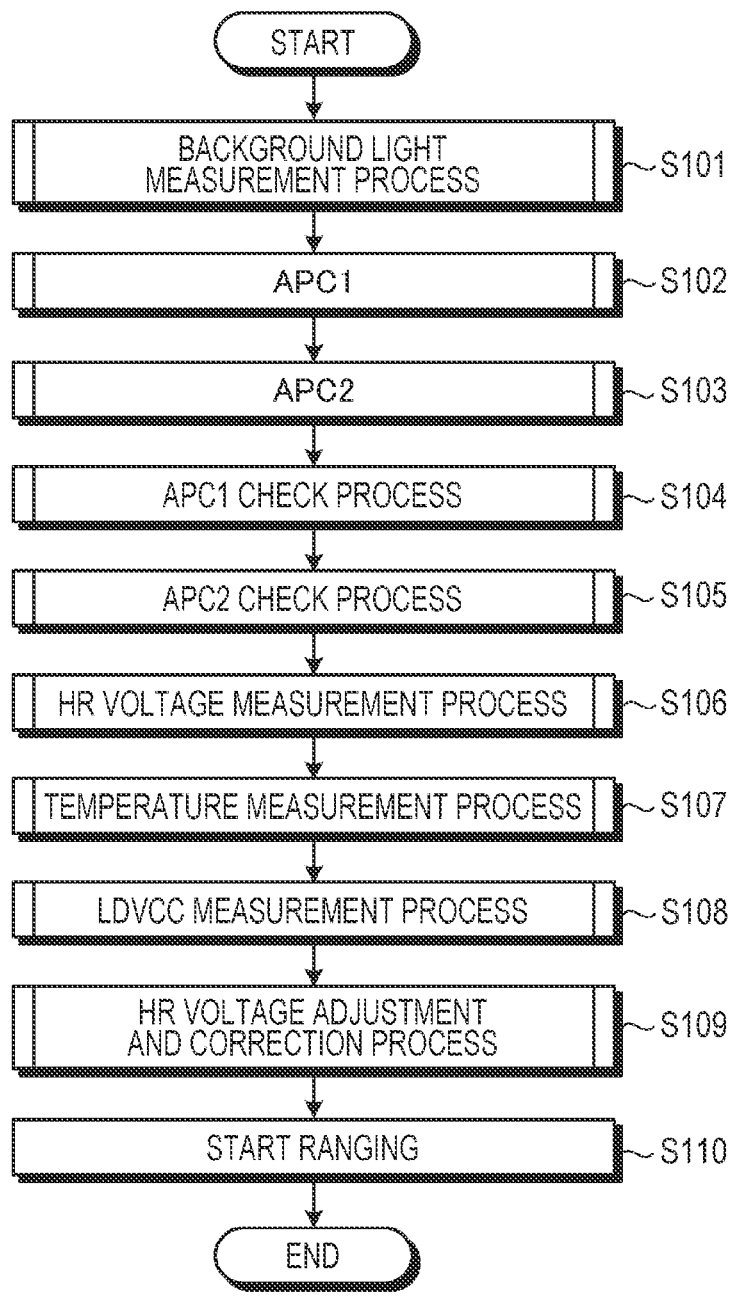
FIG. 8 is a flowchart illustrating an example of processing executed by a control unit of the LDD according to the embodiment of the present disclosure.

Next, processing executed by the control unit 1 of the LDD 133 will be described with reference to FIG. 8. FIG. 8 is a flowchart illustrating an example of the processing executed by the control unit of the LDD according to the embodiment of the present disclosure.

As illustrated in FIG. 8, the control unit 1 first executes a background light measurement process (step S101). In the background light measurement process, the control unit 1 sets the LD 121 in a non-light emitting state, and holds the amount of received light corresponding to a light reception signal output from the PD 122 as a light amount of background light according to the control of the LSI 116.

Subsequently, the control unit 1 executes APC1 according to the control of the LSI 116 (step S102). In the APC1, the control unit 1 supplies a first LD current slightly greater than the LD current at which the LD 121 enters a light emitting state from a non-light emitting state to the LD 121 to cause the LD to emit light, and holds a first amount of received light corresponding to a light reception signal output from the PD 122.

Thereafter, the control unit 1 supplies a second LD current slightly greater than the first LD current to the LD 121 to cause the LD to emit light, and holds a second amount of received light corresponding to a light reception signal output from the PD 122.

Here, a light emission intensity of the LD 121 increases linearly with an increase in the LD current until the LD current exceeds a certain threshold current. Furthermore, the light emission intensity of the LD 121 increases non-linearly with the increase in the LD current when the LD current exceeds the certain threshold current.

Using such characteristics of the LD 121, the control unit 1 calculates and holds a maximum LD current at which the LD 121 do not emit light on the basis of a reduction rate at which the second amount of received light is reduced to the first amount of received light when the second LD current equal to or less than the threshold current is reduced to the first LD current.

Subsequently, the control unit 1 executes APC2 according to the control of the LSI 116 (step S103). In the APC2, the control unit 1 calculates a target LD current that is an LD current in a case where laser light is emitted from the LD 121 to an actual ranging object.

Since it is necessary to irradiate a distant object with laser light and receive reflected light thereof in the ranging module 100, a desired intensity (hereinafter, referred to as target intensity) of the laser light of the LD 121 used at the time of ranging is extremely high.

Therefore, the LD current for emitting the laser light having the target intensity from the LD 121 exceeds the linear section and is included in the non-linear section.

Therefore, in the non-linear section of the LD current, the control unit 1 supplies a third LD current slightly less than the target LD current, obtained assuming the object in advance, to the LD 121 to cause the LD to emit light, and holds a third amount of received light corresponding to a light reception signal output from the PD 122.

Thereafter, the control unit 1 supplies a fourth LD current slightly greater than the target LD current to the LD 121 to cause the LD to emit light, and holds a fourth amount of received light corresponding to a light reception signal output from the PD 122.

Then, the control unit 1 calculates and holds the target LD current on the basis of a non-linear increase rate at which the third amount of received light is increased to the fourth amount of received light when the third LD current is increased to the fourth LD current.

Subsequently, the control unit 1 executes an APC1 check process (step S104). In the APC1 check process, the control unit 1 supplies the maximum LD current which is held in the APC1 and at which the LD 121 does not emit light to the LD 121 to cause the LD to emit light, and holds the second amount of received light corresponding to the light reception signal output from the PD 122.

Then, in a case where a difference between the held amount of received light and the light amount of background light is within a determination value, the control unit 1 determines that the maximum LD current which is held in the APC1 and at which the LD 121 does not emit light is appropriate. On the other hand, in a case where the difference between the held amount of received light and the light amount of the background light exceeds the determination value, the control unit 1 determines that an error occurs and ends the processing. In a case where the control unit 1 does not determine that an error occurs in step S104, the processing proceeds to step S105.

In step S105, the control unit 1, the control unit 1 executes an APC2 check process. In the APC2 check process, the control unit 1 determines whether or not the diffuser 123 is normally set and whether or not the target LD current is appropriate.

The control unit 1 supplies the target LD current held in the APC2 to the LD 121 to cause the LD to emit light, and holds the second amount of received light corresponding to the light reception signal output from the PD 122. Then, the control unit 1 calculates a difference between the held amount of received light and the light amount of background light.

At this time, if the diffuser 123 is set normally, a part of laser light emitted from the LD 121 is reflected by the diffuser 123 and enters the PD 122. For this reason, the difference between the amount of received light held in the APC2 check process and the light reception amount of background light increases.

On the other hand, in a case where the diffuser 123 is disengaged, a part of the laser light emitted from the LD 121 is not reflected by the diffuser 123, and thus, is not incident on the PD 122. For this reason, the amount of received light held in the APC2 check process and the light reception amount of background light are substantially equal.

Therefore, the control unit 1 determines that the diffuser 123 is normally set in a case where the difference between the amount of received light held in the APC2 check process and the light reception amount of background light exceeds a determination value. On the other hand, in a case where the difference between the amount of received light held in the APC2 check process and the light reception amount of background light is within the determination value, the control unit 1 determines that an error occurs and ends the processing.

Thereafter, the control unit 1 calculates a difference between the amount of received light held in the APC2 check process and a target light amount. The target light amount is a light amount detected by the PD 122 when laser light having the target intensity is emitted from the LD 121, and is obtained in advance by actual measurement or calculation, for example.

In a case where the difference between the amount of received light held in the APC2 check process and the target light amount is within a determination threshold, the control unit 1 determines that the target LD current held in the APC2 is appropriate. Furthermore, in a case where the difference between the amount of received light held in the APC2 check process and the target light amount exceeds the determination threshold, the control unit 1 determines that an error occurs and ends the processing.

In a case where it is not determined that an error occurs in step S105, the control unit 1 causes the processing to proceed to step S106. In step S106, the control unit 1 executes an HR voltage measurement process. In the HR voltage measurement process, the control unit 1 detects the HR voltage of the driver 31.

Subsequently, the control unit 1 executes a drive circuit temperature measurement process (step S107). In the drive circuit temperature measurement process, the control unit 1 detects the temperature of the driver 31. Thereafter, the control unit 1 executes an LDVCC measurement process (step S108). In the LDVCC measurement process, the control unit 1 detects LDVCC supplied to the LD 121.

Then, the control unit 1 executes an HR voltage adjustment and correction process (step S109). In the HR voltage adjustment and correction process, the control unit 1 adjusts and corrects LDVCC according to VOP of the LD 121 that varies depending on the temperature of the driver 31 or 31a such that the HR voltage becomes a necessary and sufficient HR voltage for causing a prescribed LD current to flow through the LD 121.

Thereafter, the control unit 1 repeats an operation of causing the LD 121 to perform the main light emission with a high-frequency pulse for distance measurement, starts the distance measurement, and ends the processing. Thereafter, the control unit 1 starts the processing again from step S101.

Note that the description has been given in the above-described embodiment regarding the case where, under the control of the LSI 116, the control unit 1 detects the temperature, the HR voltage, and LDVCC of the driver 31, and adjusts LDVCC in the test light emission period according to VOP of the LD 121 that varies depending on the temperature of the driver 31 so as to obtain the HR voltage that is necessary and sufficient for causing the prescribed LD current to flow through the LD 121, but this is an example.

For example, a configuration may be adopted in which the control unit 1 does not follow the control by the LSI 116, and the control unit 1 alone detects the temperature of the driver 31, the HR voltage, and LDVCC and adjusts LDVCC in the test light emission period according to VOP of the LD 121 that varies depending on the temperature of the driver 31 so as to obtain the HR voltage that is necessary and sufficient for causing the prescribed LD current to flow through the LD 121.

[5. Effect]

The LDD 113, which is an example of a driving device, includes the temperature monitoring circuit 33, the HR voltage monitoring circuit 37, the LDVCC monitoring circuit 32, and the control unit 1. The temperature monitoring circuit 33 detects the temperature of the driver 31 that drives the LD 121 in the test light emission period of the LD 121. The HR voltage monitoring circuit 37 detects the HR voltage of the driver 31 in the test light emission period. The LDVCC monitoring circuit 32 detects LDVCC supplied to the LD 121 in the test light emission period. The control unit 1 adjusts LDVCC in the test light emission period according to VOP of the LD 121 that varies depending on the temperature of the driver 31 so as to obtain the HR voltage that is necessary and sufficient for causing the prescribed LD current to flow through the LD 121. Therefore, the LDD 113 can reduce the power consumption of the LD 121 by supplying the minimum required LDVCC to the LD 121 in order to cause the prescribed (for example, in the specifications) LD current to flow through the LD 121.

The driver 31 includes the NMOS transistors Tr1 and Tr2 connected in series between the ground and the cathode of the LD 121 whose anode is connected to the wiring to which LDVCC is supplied. The HR voltage monitoring circuit 37 detects the potential difference between the cathode of the LD 121 and the ground as the HR voltage. Therefore, the LDD 113 can reduce the power consumption of the LD 121 in a case where the LD 121 is provided at a previous stage of the driver 31.

The driver 31a includes the PMOS transistors Tr4 and Tr5 connected in series between the wiring to which LDVCC is supplied and the anode of the LD 121 whose cathode is connected to the ground. The HR voltage monitoring circuit detects the potential difference between the wiring to which LDVCC is supplied and the anode of the LD 121 as the HR voltage. Therefore, the LDD 113 can reduce the power consumption of the LD 121 in a case where the LD 121 is provided at a subsequent stage of the driver 31a.

The control unit 1 adjusts LDVCC on the basis of the information indicating the relationship between the LD current of the LD 121 and VOP of the LD 121 that varies depending on the temperature of the driver 31. Therefore, the LDD 113 can supply the minimum required LDVCC according to the temperature variation to the LD 121, thereby causing the prescribed LD current to flow through the LD 121.

The driver 31 repeats the operation of causing the light emitting element to perform the test light emission and the operation of causing the light emitting element to perform the main light emission for distance measurement. The control unit 1 corrects the power supply voltage on the basis of the amount of temperature variation of the driver 31 detected by the temperature monitoring circuit 33 in the test light emission period before and after the main light emission and the correction coefficient of LDVCC according to the amount of temperature variation. Therefore, the LDD 113 can more accurately set the necessary and sufficient HR voltage.

The light emitting device 101 includes the LD 121, the temperature monitoring circuit 33, the HR voltage monitoring circuit 37, the LDVCC monitoring circuit 32, and the control unit 1. The LD 121 emits light for distance measurement. The temperature monitoring circuit 33 detects the temperature of the driver 31 that drives the LD 121 in the test light emission period of the LD 121. The HR voltage monitoring circuit 37 and the HR voltage of the driver 31 are detected in the test light emission period. The LDVCC monitoring circuit 32 detects LDVCC supplied to the LD 121 in the test light emission period. The control unit 1 adjusts LDVCC in the test light emission period according to VOP of the LD 121 that varies depending on the temperature of the driver 31 so as to obtain the HR voltage that is necessary and sufficient for causing the prescribed LD current to flow through the LD 121. Therefore, the light emitting device 101 can reduce the power consumption of the LD 121 by supplying the minimum required LDVCC to the LD 121 in order to cause the prescribed (for example, in the specifications) LD current to flow through the LD 121.

An information processing method, performed by the control unit 1, which is an example of a computer, including: detecting a temperature of the driver 31 that drives the LD 121 in a test light emission period of the LD 121; detecting an HR voltage of the driver 31 in the test light emission period; detecting LDVCC supplied to the LD 121 in the test emission period; and adjusting LDVCC in the test light emission period according to VOP of the LD 121 that varies depending on the temperature of the driver 31 so as to obtain an HR voltage that is necessary and sufficient for causing a prescribed drive current to flow through the LD 121. Therefore, the information processing method can reduce the power consumption of the LD 121 by supplying the minimum required LDVCC to the LD 121 in order to cause the prescribed (for example, in the specifications) LD current to flow through the LD 121.

Note that the effects described in the present specification are merely examples and are not limited, and there may be other effects.

Note that the present technology can also have the following configurations.

(1)

A driving device including:

a temperature monitoring circuit that detects a temperature of a drive circuit that drives a light emitting element in a test light emission period of the light emitting element;

a headroom voltage monitoring circuit that detects a headroom voltage of the drive circuit in the test light emission period;

a power supply voltage monitoring circuit that detects a power supply voltage supplied to the light emitting element in the test light emission period; and a control unit that adjusts the power supply voltage in the test light emission period according to an input/output potential difference of the light emitting element that varies depending on the temperature of the drive circuit to obtain a headroom voltage necessary and sufficient for causing a prescribed drive current to flow through the light emitting element.

(2)

The driving device according to (1), in which the drive circuit includes a transistor connected in series between a ground and a cathode of the light emitting element having an anode connected to a wiring to which the power supply voltage is supplied, and the headroom voltage monitoring circuit detects, as the headroom voltage, a potential difference between the cathode of the light emitting element and the ground.

(3)

The driving device according to (1), in which the drive circuit includes a transistor connected in series between a wiring to which the power supply voltage is supplied and an anode of the light emitting element having a cathode connected to a ground, and the headroom voltage monitoring circuit detects, as the headroom voltage, a potential difference between the wiring to which the power supply voltage is supplied and the anode of the light emitting element.

(4)

The driving device according to any one of (1) to (3), in which
the control unit adjusts the power supply voltage on the basis of information indicating a relationship between a drive current of the light emitting element varying depending on the temperature of the drive circuit and an input/output voltage difference of the light emitting element.

(5)

The driving device according to any one of (1) to (4), in which
the drive circuit repeats an operation of causing the light emitting element to perform test light emission and an operation of causing the light emitting element to perform main light emission for distance measurement, and
the control unit corrects the power supply voltage on the basis of an amount of temperature variation of the drive circuit, detected by the temperature monitoring circuit in the test light emission period before and after the main light emission, and a correction coefficient of the power supply voltage according to the amount of temperature variation.

(6)

A light emitting device including:
a light emitting element that emits light for distance measurement;
a temperature monitoring circuit that detects a temperature of a drive circuit that drives the light emitting element in a test light emission period of the light emitting element;
a headroom voltage monitoring circuit that detects a headroom voltage of the drive circuit in the test light emission period;
a power supply voltage monitoring circuit that detects a power supply voltage supplied to the light emitting element in the test light emission period; and
a control unit that adjusts the power supply voltage in the test light emission period according to an input/output potential difference of the light emitting element that varies depending on the temperature of the drive circuit to obtain a headroom voltage necessary and sufficient for causing a prescribed drive current to flow through the light emitting element.

(7)

A driving method including:
detecting, by a computer, a temperature of a drive circuit that drives a light emitting element in a test light emission period of the light emitting element;
detecting, by the computer, a headroom voltage of the drive circuit in the test light emission period;
detecting, by the computer, a power supply voltage supplied to the light emitting element in the test light emission period; and
adjusting, by the computer, the power supply voltage in the test light emission period according to an input/output potential difference of the light emitting element that varies depending on the temperature of the drive circuit to obtain a headroom voltage necessary and sufficient for causing a prescribed drive current to flow through the light emitting element.

REFERENCE SIGNS LIST

1 Control unit
2 DCDC converter
3 LDDIC
31, 31a Drive circuit
32 LDVCC monitoring circuit
33 Temperature monitoring circuit
34 Selector
35 AD converter
36 Logic circuit
37 HR voltage monitoring circuit
100 Ranging module
101 Light emitting device
112 Optical module
113 LDD
114 Lens
115 Distance image sensor
116 LSI
121 LD
122 PD
123 Diffuser

What is claimed is:

1. A driving device comprising:
a temperature monitoring circuit that detects a temperature of a drive circuit that drives a light emitting element in a test light emission period of the light emitting element;
a headroom voltage monitoring circuit that detects a headroom voltage of the drive circuit in the test light emission period;
a power supply voltage monitoring circuit that detects a power supply voltage supplied to the light emitting element in the test light emission period; and
a control unit that adjusts the power supply voltage in the test light emission period according to an input/output potential difference of the light emitting element that varies depending on the temperature of the drive circuit to obtain a headroom voltage necessary and sufficient for causing a prescribed drive current to flow through the light emitting element.

2. The driving device according to claim 1, wherein
the drive circuit includes a transistor connected in series between a ground and a cathode of the light emitting element having an anode connected to a wiring to which the power supply voltage is supplied, and
the headroom voltage monitoring circuit detects, as the headroom voltage, a potential difference between the cathode of the light emitting element and the ground.

3. The driving device according to claim 1, wherein
the drive circuit includes a transistor connected in series between a wiring to which the power supply voltage is supplied and an anode of the light emitting element having a cathode connected to a ground, and
the headroom voltage monitoring circuit detects, as the headroom voltage, a potential difference between the wiring to which the power supply voltage is supplied and the anode of the light emitting element.

4. The driving device according to claim 1, wherein
the control unit adjusts the power supply voltage on a basis of information indicating a relationship between a drive current of the light emitting element varying depending on the temperature of the drive circuit and an input/output voltage difference of the light emitting element.

5. The driving device according to claim 1, wherein
the drive circuit repeats an operation of causing the light emitting element to perform test light emission and an operation of causing the light emitting element to perform main light emission for distance measurement, and the control unit corrects the power supply voltage on a basis of an amount of temperature variation of the drive circuit, detected by the temperature monitoring circuit in the test light emission period before and after the main light emission, and a correction coefficient of the power supply voltage according to the amount of temperature variation.

6. A light emitting device comprising:
a light emitting element that emits light for distance measurement;
a temperature monitoring circuit that detects a temperature of a drive circuit that drives the light emitting element in a test light emission period of the light emitting element;
a headroom voltage monitoring circuit that detects a headroom voltage of the drive circuit in the test light emission period;
a power supply voltage monitoring circuit that detects a power supply voltage supplied to the light emitting element in the test light emission period; and
a control unit that adjusts the power supply voltage in the test light emission period according to an input/output potential difference of the light emitting element that varies depending on the temperature of the drive circuit to obtain a headroom voltage necessary and sufficient for causing a prescribed drive current to flow through the light emitting element.

7. A driving method comprising:
detecting, by a computer, a temperature of a drive circuit that drives a light emitting element in a test light emission period of the light emitting element;
detecting, by the computer, a headroom voltage of the drive circuit in the test light emission period;
detecting, by the computer, a power supply voltage supplied to the light emitting element in the test light emission period; and
adjusting, by the computer, the power supply voltage in the test light emission period according to an input/output potential difference of the light emitting element that varies depending on the temperature of the drive circuit to obtain a headroom voltage necessary and sufficient for causing a prescribed drive current to flow through the light emitting element.

* * * * *